US010589457B2

(12) United States Patent
Chouiki

(10) Patent No.: US 10,589,457 B2
(45) Date of Patent: Mar. 17, 2020

(54) EMBOSSING COMPOUND FOR EMBOSSING LITHOGRAPHY

(71) Applicant: EV GROUP E. THALLNER GMBH, St. Florian am Inn (AT)

(72) Inventor: Mustapha Chouiki, Linz (AT)

(73) Assignee: EV GROUP E. THALLNER GMBH, St. Florian am Inn (AT)

( * ) Notice: Subject to any disclaimer, the term of this patent is extended or adjusted under 35 U.S.C. 154(b) by 78 days.

(21) Appl. No.: 15/952,795

(22) Filed: Apr. 13, 2018

(65) Prior Publication Data

US 2018/0229419 A1 Aug. 16, 2018

Related U.S. Application Data

(63) Continuation of application No. 14/897,366, filed as application No. PCT/EP2013/062711 on Jun. 19, 2013, now Pat. No. 9,981,419.

(51) Int. Cl.

| | |
|---|---|
| ***B29C 59/00*** | (2006.01) |
| ***C08L 83/04*** | (2006.01) |
| ***G03F 7/00*** | (2006.01) |
| ***C08L 71/00*** | (2006.01) |
| *B29C 59/16* | (2006.01) |
| *B82Y 40/00* | (2011.01) |
| *B29K 83/00* | (2006.01) |
| *B29K 85/00* | (2006.01) |

(52) U.S. Cl.

CPC ............ *B29C 59/005* (2013.01); *C08L 71/00* (2013.01); *C08L 83/04* (2013.01); *G03F 7/0002* (2013.01); *B29C 59/16* (2013.01); *B29K 2083/00* (2013.01); *B29K 2085/00* (2013.01); *B82Y 40/00* (2013.01)

(58) Field of Classification Search

None

See application file for complete search history.

(56) References Cited

U.S. PATENT DOCUMENTS

| | | | |
|---|---|---|---|
| 7,273,564 | B2 | 9/2007 | Kim |
| 7,335,520 | B2 | 2/2008 | Kim |
| 8,012,667 | B2 | 9/2011 | Nam et al. |
| 9,063,408 | B2 | 6/2015 | Nilsson et al. |
| 2005/0139576 | A1 | 6/2005 | Kim |
| 2005/0202350 | A1 | 9/2005 | Colburn et al. |
| 2008/0017312 | A1 | 1/2008 | Kim |
| 2008/0044743 | A1 | 2/2008 | Nam et al. |
| 2008/0113283 | A1 | 5/2008 | Ghoshal et al. |
| 2008/0157438 | A1 | 7/2008 | Song |
| 2008/0277826 | A1 | 11/2008 | Chou et al. |
| 2009/0189317 | A1 | 7/2009 | Sato et al. |
| 2009/0194502 | A1 | 8/2009 | Houle et al. |
| 2009/0256287 | A1 | 10/2009 | Fu et al. |
| 2010/0155989 | A1 | 6/2010 | Ishii et al. |
| 2010/0160478 | A1 | 6/2010 | Nilsson et al. |
| 2010/0206470 | A1 | 8/2010 | Chen et al. |
| 2011/0017705 | A1 | 1/2011 | Jalabert |
| 2011/0042862 | A1 | 2/2011 | Houle et al. |
| 2011/0278772 | A1 | 11/2011 | Inamiya et al. |
| 2011/0305787 | A1 | 12/2011 | Ishii et al. |
| 2013/0214453 | A1 | 8/2013 | Umekawa et al. |
| 2014/0037900 | A1 | 2/2014 | Takihara et al. |

FOREIGN PATENT DOCUMENTS

| | | | |
|---|---|---|---|
| CN | 101842745 | A | 9/2010 |
| CN | 103087087 | A | 5/2013 |
| JP | H04289865 | A | 10/1992 |
| JP | 2005196168 | A | 7/2005 |
| JP | 2006-139249 | A | 6/2006 |
| JP | 2008006820 | A | 1/2008 |
| JP | 2010006870 | A | 1/2010 |
| JP | 2010183064 | A | 8/2010 |
| JP | 2010280159 | A | 12/2010 |
| JP | 2011216684 | A | 10/2011 |
| WO | WO-2003/086959 | A2 | 10/2003 |
| WO | WO-2007/127984 | A2 | 11/2007 |
| WO | WO-2010/079820 | A1 | 7/2010 |
| WO | WO-2011-155582 | A1 | 12/2011 |
| WO | WO-2012/053543 | A1 | 4/2012 |
| WO | WO-2012/141238 | A1 | 10/2012 |
| WO | WO-2013/060087 | A1 | 5/2013 |

OTHER PUBLICATIONS

International Search Report from corresponding International Patent Application No. PCT/EP2013/062711 dated Mar. 3, 2014.

EPO Office Action issued in connection with corresponding European Patent Application No. 13731723.6 dated Jul. 11, 2016.

Tajima, Seitaro, "Silsesquioxane derivatives,"SQ Series, Annual research report of Toagosei Co., Ltd., JP, Toagosei Co., Ltd., Jan. 1, 2004, No. 7, pp. 37-41 (partial English-language translation provided).

Office Action issued in corresponding U.S. Appl. No. 14/897,366 dated Nov. 16, 2016.

Office Action issued in corresponding U.S. Appl. No. 14/897,366 dated Mar. 16, 2017.

Office Action issued in corresponding U.S. Appl. No. 14/897,366 dated Sep. 1, 2017.

*Primary Examiner* — Marc S Zimmer

(74) *Attorney, Agent, or Firm* — Kusner & Jaffe

(57) ABSTRACT

An embossing material that can be hardened and used for embossing lithography, comprised of a mixture of at least one polymerizable main component, and at least one secondary component. The invention also relates to a use of the embossing material for the primary forming of an embossing form.

7 Claims, 1 Drawing Sheet

EMBOSSING COMPOUND FOR EMBOSSING LITHOGRAPHY

RELATED APPLICATIONS

This application is a continuation of U.S. application Ser. No. 14/897,366, filed Dec. 10, 2015 which is a U.S. National Stage of International Application No. PCT/EP2013/062711, filed Jun. 19, 2013.

FIELD OF THE INVENTION

The invention relates to an embossing material and uses thereof.

BACKGROUND OF THE INVENTION

In the semiconductor industry, embossing lithography methods are used increasingly to supplement or to replace standard optical lithography methods. By using microstructured and/or nanostructured embossing dies, a mechanical option of structuring viscous embossing materials, not limited to optical diffraction phenomena, is obtained. The structured, viscous embossing materials are cross-linked/hardened before and/or during the embossing process in order to remain dimensionally stable. In this case, the cross-linking is done in particular via electromagnetic radiation, preferably UV light, and/or by means of heat, i.e., thermally. After the cross-linking, the embossing die can be removed from the hardened embossing material. The remaining hardened embossing material either has a functional shape already or is further treated in subsequent process steps. A large amount of embossing material, primarily based on inorganic molecules, is heat-treated still at very high temperatures after the demolding step. The heat treatment ensures that the embossing material is irreversibly hardened. When using embossing materials with organic and inorganic molecules, the heat treatment primarily ensures that organic parts are removed from the embossing material and the inorganic molecules are cross-linked with one another. As a result, it is possible to structure an embossing material that is comprised of organic and inorganic molecules by die processes and to convert it after the die process into a completely inorganic material.

In order to carry out the structuring of the embossing material, special embossing dies are required. The embossing dies must meet extremely high requirements so that their micro- and/or nanometer-size structures can be transferred perfectly as negatives into the embossing material. In the state of the art, many different types of dies exist. A distinction is made in principle between hard and soft dies.

A hard die is comprised of metal, glass, or ceramic. It is less deformable, corrosion-resistant, wear-resistant, and very costly in production. The surface of the hard die is in most cases processed by electron beam lithography or laser beam lithography. These production methods are in general very expensive. The advantage of the hard die lies primarily in the high wear resistance. A decisive disadvantage exists in the high level of bending resistance, which does not allow the embossing die to be pulled off in pieces from the embossing material, as is possible in the case of soft dies. The hard die can be raised from the embossing material by a normal force only over its entire surface.

A soft die is very often formed as a negative of a hard die. In most cases, it is comprised of a polymer, and it has a high elasticity and a low bending strength. In most cases, it is entropy-elastic. The reason is primarily a high level of adhesion between the embossing material and the soft die and/or a swelling of the soft die. Soft dies can be distinguished from hard dies by various chemical, physical, and technical parameters. A distinction based on the elasticity property would be conceivable. Soft dies have a deformation property based primarily on entropy elasticity, and hard dies have a deformation property based primarily on energy elasticity. In addition, the two types of dies can be distinguished by, for example, their hardness. Hardness is the resistance that a material puts up against a penetrating body. Since hard dies are primarily comprised of metals or ceramics, they have correspondingly high hardness values. There are various ways of indicating the hardness of a solid. A very common method is the indication of the hardness according to Vickers. Without going into detail, it can be roughly stated that hard dies are to have Vickers hardness values of greater than 500 HV. Theoretically, such soft dies should be removable very simply from the embossing material, which is often not the case, however. The greatest problems with the current embossing techniques thus consist primarily in the demolding step, i.e., in the separation of the embossing die, in particular a soft die, from the embossing material.

SUMMARY OF THE INVENTION

It is therefore the object of this invention to provide an embossing material that can be better detached from the embossing die.

This object is achieved with the features of the independent claim(s). Advantageous further developments of the invention are indicated in the subclaims. All combinations of at least two of the features indicated in the specification, the claims, and/or the figures also fall within the scope of the invention. In the indicated ranges of values, values that lie within the above-mentioned limits are also to be considered disclosed as boundary values and can be claimed in any combination.

The invention describes an embossing material for embossing lithography as well as applications/uses of the embossing material according to the invention. The embossing material is distinguished by a mixture of at least one main component, preferably comprised of inorganic and/or organic parts, and at least one secondary component, preferably an organic component, which is suitable/used in particular for setting the interaction property of the embossing material with water. A main component is defined as a component that contributes to a predominant extent to the creation of the final embossed shape. A secondary component is defined as all other components that are mixed with the main component, these include primarily those organic components by means of which hydrophilicity or hydrophobicity according to the invention is set/affected, initiators, and solvents. According to the invention, the embossing material can therefore also be comprised of several main components and/or several secondary components. Hereinafter, no more than one main component and one secondary component are mentioned by way of example, although several main components and/or several secondary components according to the invention can be provided in the embossing material according to the invention.

According to the invention, there is thus a first component, the main component. The second component is a component, preferably an organic compound, which contributes substantially to setting hydrophilicity or hydrophobicity according to the invention. The third component is a solvent. The fourth component is an initiator, preferably a photoinitiator, which starts the polymerization between the main components. This mixture, comprised of at least four components, is deposited on a substrate by a coating process. With its percent by weight, the solvent greatly outweighs the percent by weight of the main component at least before the primary forming of the embossing material. The proportion of the main component in percent by weight is less than 10%, preferably less than 8%, more preferably les than 6%, even more preferably less than 4%, and most preferably less than 3%. The proportion of the second component that is substantially responsible for setting the hydrophilicity or hydrophobicity in percent by weight is less than 2%, preferably less than 1.5%, more preferably less than 1.0%, even more preferably less than 0.5%, and most preferably less than 0.1%. The proportion of the initiator that is used, preferably a photoinitiator, in percent by weight is less than 2%, preferably less than 1.5%, more preferably less than 1.0%, even more preferably less than 0.5%, and most preferably less than 0.2%. The proportion of the solvent that is used in percent by weight is less than 98%, preferably less than 96%, more preferably less than 94%, even more preferably less than 92%, and most preferably less than 90%. After the solvent was removed from the mixture or has been volatilized, the percents by weight of the embossing material according to the invention are changed accordingly.

Polymerization, shrinkage and/or adhesion can be set specifically or at least can be affected by the secondary components that are in particular organic. Preferably, the organic secondary component is selected in such a way that the adhesion between embossing material and embossing die is as small as possible and so that a simple demolding of the embossing die from the embossing material is made possible. In particular, for a demolding that is as simple as possible, the surface of the embossing material is selected to be hydrophobic when the embossing die surface is hydrophilic, and vice versa.

According to an advantageous embodiment of the invention, a combination of hydrophobic die surface and hydrophobic surface of the embossing material is especially optimal for a demolding. The optimal combination can be determined empirically according to the invention.

Hydrophilicity is defined as the high capacity of the surface of a substance for interaction with water. Hydrophilic surfaces are primarily polar and interact correspondingly well with the permanent dipoles of the molecules of fluids, preferably with water. The hydrophilicity of a surface is quantified by means of a contact angle measuring device. Hydrophilic surfaces in this case have very small contact angles. If the embossing material according to the invention must have a hydrophilic surface in order to be able to be demolded as easily as possible from the die, then the following value ranges according to the invention are to be considered: a hydrophilic surface has, according to the invention, in particular a contact angle smaller than 90°, preferably smaller than 60°, more preferably smaller than 40°, even more preferably smaller than 20°, and with utmost preference less than 1°.

Hydrophobia is correspondingly defined as the low capacity of the surface of a substance for interaction with water.

Hydrophobic surfaces are primarily nonpolar and hardly interact with the permanent dipoles of the molecules of fluids. If the embossing material according to the invention has a hydrophobic surface in one embodiment of the invention in order that it be able to be demolded as easily as possible from the die, then the following value ranges according to the invention are to be considered: a hydrophobic surface has, according to the invention, a contact angle of greater than 90°, preferably greater than 100°, more preferably greater than 120°, even more preferably greater than 140°, and with utmost preference greater than 160°. According to another, in particular independent, aspect of the invention, an embossing material is provided, in which the mixing ratio between a main component and at least one secondary component is set in such a way that after an embossing process, the embossing material resulting therefrom can be loosened by an embossing die owing to the property of low adhesion of the embossing material to the embossing die of the latter without damaging the embossed structure. The main component in this case is preferably an organic/inorganic compound. In this case, the secondary component is preferably an organic compound.

The invention is further based on the particularly independent idea of producing an embossing material from a special mixture. The mixture is comprised of at least one main component and at least one secondary component. The main component is preferably a silsesquioxane. According to the invention, in addition the following materials would be conceivable:

Polyhedral, oligomeric silsesquioxane (POSS)
Polydimethylsiloxane (PDMS)
Tetraethylorthosilicate (TEOS)
Poly(organo)siloxane (silicone)
Perfluoropolyether (PFPE)

The secondary components are comprised of any organic and/or inorganic compound. The secondary components are primarily responsible for the setting of the hydrophilicity or hydrophobicity according to the invention, which allows the facilitated demolding of the die from the embossing material according to the invention. Especially preferably, the secondary components have corresponding functional groups that affect hydrophilicity or hydrophobicity. These secondary components can have any complicated, preferably organic, design. Since it is not possible to list all possible compounds that can affect the hydrophilicity or hydrophobicity according to the invention of the embossing material according to the invention, instead some collective designations of chemical substances and/or functional groups are mentioned. Accordingly, compounds can include a combination of the elements of the following list. All chemical compounds that appear in the list can be used as monomers or polymers. At least one of the secondary components is preferably an organic compound, in particular one of the following compounds:

Acrylic or (poly)acrylate
Epoxides
Epoxy resins
Phenols
Alkane
Alkene
Alkyne
Benzene
Ether
Ester
Carboxylic acid
Ketone
Alcohol.

In a quite special embodiment, the secondary component can belong to the same functional group as the organic functional groups of the main component.

Solvents are always used to dissolve the main components, the initiators, and the organic components according to the invention, by means of which hydrophilicity or hydrophobicity is set and/or affected. Preferably, the solvents are removed from the embossing material according to the invention or escape on their own in the course of the production process of the actual structure. Preferably, one of the following solvents is used:

Acetone
Acetonitrile
Aniline
Cyclohexane
n-Pentane
Triethylene glycol dimethyl ether (triglyme)
Dimethylacetamide
Dimethylformamide
Dimethyl sulfoxide
1,4-Dioxane
Glacial acetic acid
Acetic anhydride
Ethyl acetate
Ethanol
Ethylene dichloride
Ethylene glycol
Anisole
Benzene
Benzonitrile
Ethylene glycol dimethyl ether
Petroleum ether/light gasoline
Piperidine
Propanol
Propylene carbonate (4-methyl-1,3-dioxol-2-one)
Pyridine
γ-Butyrolactone
Quinoline
Chlorobenzene
Chloroform
n-Heptane
2-Propanol (isopropyl alcohol)
Methanol
3-Methyl-1-butanol (isoamyl alcohol)
2-Methyl-2-propanol (tert-butanol)
Methylene chloride
Methyl ethyl ketone (butanone)
N-Methyl-2-pyrrolidone (NMP)
N-Methylformamide
Tetrahydrofuran
Lactic acid ethyl ester
Toluene
Dibutyl ether
Diethylene glycol
Diethyl ether
Bromobenzene
1-Butanol
tert-Butyl methyl ether (TBME)
Triethylamine
Triethylene glycol
Formamide
N-Hexane
Nitrobenzene
Nitromethane
1,1,1-Trichloroethane
Trichloroethene
Carbon disulfide
Sulfolane
Tetrachloroethene
Carbon tetrachloride
Propylene glycol monomethyl ether acetate (PGMEA)
Water.

The main components and the secondary components are mixed together with initiators, which start the chain reaction, in a corresponding stoichiometrically correct ratio. Owing to the mixing of the main component with the secondary component and the initiator, in the case of activation of the initiator, it results in a polymerization, especially or at least predominantly between organic parts of the main components. It may be that the secondary components partially take part in the polymerization. In particular, only the main components polymerize among one another. During polymerization, long-chain molecules and/or complete 2D- and/or 3D-networks are preferably produced with a specially adjustable number of monomers. In this case, the number of monomers is greater than 1, preferably greater than 10, more preferably greater than 100, and most preferably greater than 1,000, and with utmost preference, the monomers polymerize to form a complete 2D- and/or 3D-network.

Hydrophilicity (or hydrophobicity) of the embossing material according to the invention can be set by the quantitative ratio between the main component and the secondary component. Since the main component is preferably at least predominantly, in particular completely, a primarily inorganic material, preferably a silsesquioxane, hydrophilicity is preferably determined by the type and the amount of the secondary component. Hydrophilicity primarily depends on the polarity of the organic and/or inorganic compounds of the secondary component(s). Preferably, hydrophilicity and hydrophobicity alternate between the embossing material and the embossing die according to the invention. If the embossing die is hydrophobic, the embossing material is preferably hydrophilic, and vice versa. The surface of the embossing die that is used is preferably selected to be hydrophobic. A very optimal combination can be the use of a hydrophobic embossing material according to the invention with a hydrophobic die.

The embossing material that is in particular hydrophilic advantageously has an adhesion to the embossing die that is as low as possible. The adhesive capacity between two surfaces can be best described by energy per unit surface, i.e., energy surface density. This refers to the energy that is necessary to separate from one another again two surfaces that are connected to one another along the unit surface. The adhesion between embossing material and embossing die is set in particular, according to the invention, less than 2.5 J/m2, preferably less than 1 J/m2, more preferably less than 0.1 J/m2, even more preferably less than 0.01 J/m2, most preferably less than 0.001 J/m2, with utmost preference less than 0.0001 J/m2, and most preferably less than 0.00001 J/m2.

In a first special embodiment, the embossing material is comprised of at least, in particular exactly, four components. The main component is any chemical compound that is based on silicon oxide, preferably a silsesquioxane, while the secondary component is preferably a particularly pure organic compound. The third component is in particular a solvent. The fourth component is in particular an initiator, preferably a photoinitiator, which starts the polymerization between the main components. This mixture, comprised of at least four components, is deposited on a substrate by a coating process. With its percent by weight, the solvent greatly outweighs the percent by weight of the main component, the secondary component, and the initiators. The proportion of the main component in percent by weight is less than 10%, preferably less than 8%, more preferably less than 6%, even more preferably less than 4%, and most preferably less than 3%. The proportion of the secondary component that is substantially responsible for setting the hydrophilicity or hydrophobicity in percent by weight is less than 2%, preferably less than 1.5%, more preferably less than 1.0%, even more preferably less than 0.5%, and most preferably less than 0.1%. The proportion of the initiator, preferably a photoinitiator, that is used in percent by weight is less than 2%, preferably less than 1.5%, more preferably less than 1.0%, even more preferably less than 0.5%, and most preferably less than 0.2%. The proportion of the solvent that is used in percent by weight is less than 98%, preferably less than 96%, more preferably less than 94%, even more preferably less than 920%, and most preferably less than 90%. After the solvent was removed from the mixture or has been volatilized, the percents by weight of the embossing material according to the invention are changed accordingly.

In a second special embodiment, the embossing material is also comprised of at least, in particular exactly, four components. The main component is any chemical compound that is based on the atoms silicon and oxygen, preferably a TEOS (tetraethyl orthosilicate) compound. The second component is preferably an organic compound. The third component is in particular a solvent. The fourth component is in particular an initiator, preferably a photoinitiator, which starts the polymerization between the main components. This mixture, comprised of at least four components, is deposited on a substrate by a coating process. With its percent by weight, the solvent greatly outweighs the percents by weight of the main component, the secondary component, and the initiators. The proportion of the main component in percent by weight is less than 10%, preferably less than 8%, more preferably les than 6%, even more preferably less than 4%, and most preferably less than 3%. The proportion of the secondary component that is substantially responsible for setting hydrophilicity or hydrophobicity in percent by weight is less than 2%, preferably less than 1.5%, more preferably less than 1.0%, even more preferably less than 0.5%, and most preferably less than 0.1%. The proportion of the initiator that is used, preferably a photoinitiator, in percent by weight is less than 2%, preferably less than 1.5%, more preferably less than 1.0%, even more preferably less than 0.5%, and most preferably less than 0.2%. The proportion of the solvent that is used in percent by weight is less than 98%, preferably less than 96%, more preferably less than 94%, even more preferably less than 92%, and most preferably less than 900/%. After the solvent was removed from the mixture or has been volatilized, the percents by weight of the embossing material according to the invention are changed accordingly.

In particular, thermoinitiators and/or photoinitiators are added to the embossing materials in order to cure or cross-link the embossing material and in order to bring them into a hardened form in a particularly irreversible manner. Photoinitiators that are preferred according to the invention react in a sensitive manner in the range between 100 nm and 1,000 nm, preferably between 200 nm and 500 nm, and more preferably between 300 nm and 400 nm. Thermoinitiators start the cross-linking between 25° C. and 400° C., preferably between 50° C. and 300° C., and more preferably between 100° C. and 200° C.

After the cross-linking process, the embossing die is removed from the embossing material. The embossing materials according to the invention are suitable not exclusively but primarily for embossing processes in which the embossing die is removed from the embossing material not under a pure normal force over the entire surface but rather by a peeling or rolling process. For a soft die, it is common to pull the soft die off the embossing material rather than to raise it. In this type of demolding, the force must be applied along the separating line/separating front at which separation takes place only for the separation between embossing die and embossing material.

In another optional process step according to the invention, the embossing material is fed to a high-temperature process in order to sinter it. During the sintering process, all organic radicals are preferably oxidized in the embossing material and removed from the embossing material so that a pure, preferably inorganic, structure, most preferably an $SiO_2$ structure, remains. The sintering is carried out in particular at more than 50° C., preferably at more than 200° C., more preferably at more than 400° C., most preferably at more than 600° C., with utmost preference at more than 800° C., and most preferably at more than 1,000° C.

The oxidation of the organic radicals in the embossing material is especially efficiently carried out in an atmosphere with a high proportion of oxygen. The proportion of oxygen is in particular greater than 20%, preferably greater than 60%, more preferably more than 80%, and with utmost preference at 100%. Special sintering atmospheres that are comprised of a high-oxidizing component, such as oxygen, and an inert gas component, such as nitrogen, argon, helium or carbon dioxide, would also be conceivable.

The embossing material according to the invention can be used for various applications, especially preferably for the following uses:

In a first, in particular independent, embodiment according to the invention, the embossing material according to the invention is used as a protective material or as an encapsulating material. To this end, the embossing material is applied over the structure that is to be protected in a first step according to the invention. Then, either a planarization of the embossing material by a non-structured, flat embossing die or a structuring by a structured embossing die is preferably carried out. The planarization of the embossing material according to the invention is used in particular for an additional process step, which requires a flat surface. The structuring of the embossing material according to the invention allows the functionalization of the embossing material that is actually provided only as protective material. The use according to the invention for the embossing of a lens, one or more channels for microfluid devices, a cavity for MEMs, or a structuring for another functional component via the structure to be protected or encapsulated would be conceivable. The protective material can accomplish various tasks as a protective layer. If the protective layer is optically transparent, it allows electrical and/or magnetic insulation of the underlying components without the transparency for electromagnetic beams being limited in specific wavelength ranges. Thus, in particular the communication between two optoelectronic components through the protective material would also be conceivable. Component groups could be insulated electrically and/or magnetically from the environment according to the invention and nevertheless communicate. The protective material is in particular electrically insulating. Electrical insulation is a property of dielectrics. Primarily $SiO_2$-based materials are especially suitable, owing to their binding structure and their band structure, for electrically insulating components. Thus, a galvanic separation from the environment is carried out. The protective materials are preferably very thermally stable. Since primarily inorganic materials, in particular oxide ceramics, have very high melting points, a protective shell that is stable up to very high temperatures can be provided with the embodiment according to the invention. In addition, the embossing materials according to the invention are primarily chemically inert. This makes them resistant against acids, bases, oxidation, and reduction. These above-mentioned chemical drawbacks can occur either during the further processing of the components or in later use.

In a quite preferred, in particular independent, embodiment of this invention, the embossing material is applied by a deposition process and in the corresponding distribution remains on the surface without being changed by a planarization process or an embossing process. The embossing material could be applied by, for example, a spray-enameling process with an extremely small thickness over the structures that are to be protected. This special embodiment has the advantage that the embossing material still follows the topography of the surface and does not completely cover the latter. Another possible application would be the distribution of an embossing material, preferably applied in the center, by a centrifugal enameling process. This variant would be suitable primarily for flat structures, which have to be protected. Should the embossing material according to the invention have a thickness that is larger by a multiple than the structures that are to be protected, the centrifugal enameling can also be used successfully for deposition. After the above-mentioned process steps, an irreversible hardening of the embossing material is carried out by at least one of the methods already mentioned.

In a second, in particular independent, embodiment according to the invention, the embossing material according to the invention is used as a basic material for various functional units. In this case, the embossing material according to the invention is itself starting material and does not protect a structure as in the previously-mentioned embodiment according to the invention but rather serves as a building stock. The embossing of MEMS assemblies (MEMS devices), microfluid assemblies (microfluidic devices), or photonic crystals would be conceivable. In this case, the embossing material according to the invention is preferably applied on a substrate. Although in turn any known deposition process for application of the embossing material according to the invention on the preferably completely flat substrate can be carried out, primarily centrifugal enameling is suitable for this embodiment according to the invention. In a first process step, a pool of the embossing material according to the invention is applied, preferably to the center, on one place of the substrate. Then, a centrifugal enameling process distributes the embossing material according to the invention uniformly over the entire surface of the substrate. In this case, the layer thickness of the embodiment according to the invention is preferably completely homogeneous. In a second process step according to the invention, the embossing of the embossing material according to the invention is done with an embossing die. In this case, the structure of the embossing die is transferred as a negative into the embossing material according to the invention. For example, the production of process chambers, channels, mixing chambers, general cavities, etc., which are required primarily for the production of microfluid components, would be conceivable. In addition, the production of cavities for MEMS assemblies or LED assemblies would be conceivable. In particular, parts of assemblies are produced by this embodiment according to the invention, which assemblies by themselves are not completely efficient. In general, the structuring of the embossing material according to the invention is disclosed. Immediately after the above-mentioned process steps, an irreversible hardening of the embossing material is carried out by at least one of the already mentioned methods. The advantage of this embodiment according to the invention can be seen primarily in the production of microfluid assemblies.

Microfluid assemblies are distinguished by channels, reaction chambers, mixing chambers, pump chambers, and/or analysis chambers. The various chambers are connected to one another via the channels. Microfluid assemblies now transport fluids, gases and/or liquids from one place on the microfluid assembly to a second place, whereby the fluid runs through one or more of the chambers. In the chambers, in particular physical and/or chemical processes take place. These processes either change the fluid or allow the generation of a physical measuring signal, by means of which an assessment on the fluid is obtained. A typical chemical process would be a mixing process in a mixing chamber between a first fluid and a second fluid. Another chemical process would be in particular the reaction of a first fluid and a second fluid to form a third fluid in a reaction chamber. A typical physical process would be the striking of a fluid with a laser, which excites the fluid to fluoresce. The emitted radiation can then be detected accordingly and allows assessments on the fluid. One of the most important uses of the microfluid assembly according to the invention is the sequencing of macromolecules, preferably DNA fragments, especially preferably complete DNA strands. In this case, the following process preferably takes place in the microfluid assembly. A solution with a macromolecule that is to be sequenced is introduced into the microfluid assembly. In a first reaction chamber, parts of the macromolecules that are to be sequenced bind to the surface of the reaction chamber. The macromolecules that are to be sequenced preferably bind with their two ends to the surface so that they form a molecular "archway," i.e., bend in the shape of an arch. In another step, the thus bonded macromolecules are replicated by a solution with corresponding building blocks being brought into the microfluid assembly. After the successful replication of the macromolecules, the latter are sequenced in series by defined marker molecules, whose functional group can dock on parts of the macromolecules that are to be sequenced, alternately flowing through the microfluid assembly. If a docking of the marker molecules on the macromolecules that are to be sequenced is carried out, a corresponding sensor, preferably an optical sensor, which can detect the interaction of electromagnetic radiation, irradiated in the microfluid assembly, with the marker molecules, can detect and digitally store the docking process. By repeatedly flowing through various marker molecules, the entire macromolecule can be sequenced according to the invention. The embossing material according to the invention and the embossing products that are produced therefrom decisively improve the production, structuring, and efficiency of such microfluid assemblies.

According to a third, in particular independent, embodiment according to the invention, the embossing material according to the invention is used for the production of optical elements, which, taken by themselves, are already completely efficient and which accomplish the task intended for them. These primarily include convex and concave lenses, diffractive optical elements (DOE), such as, for example, Fresnel lenses, diffraction grating, and phase grating. Especially preferably, the optical elements that are produced by an embossing step can be arranged via a functional unit, such as, for example, an image sensor, a camera, a CCD detector, an LED, a laser diode, a photodiode, or a temperature sensor. The optical effects that are achieved from the optical elements produced according to the invention, namely the change in intensity, phase, and direction of the incident or exiting electromagnetic beams, are thus combined directly with an analysis unit (photodiode, image sensor, etc.) or a production unit (LED, laser diode, etc.).

In a fourth, in particular independent, embodiment according to the invention, the embossing material according to the invention is used as an etching mask. In this case, the embossing material according to the invention is applied in a first step according to the invention over a surface that is to be etched. Then, in a second step according to the invention, the structuring of the embossing material according to the invention is carried out by an embossing die. In this case, the structuring can be carried out in such a way that the places on the substrate surface to be reached by the etching fluid that is used are completely removed from the embossing material according to the invention. A type of etching mask production that is preferred according to the invention consists in that the places of the substrate surface that are to be reached by the etching fluid that is used still remain at least partially covered with an embossing material according to the invention.

In a third process step, the hardening of the embossing material according to the invention is then carried out, followed by the etching of the embossing material according to the invention. In this case, specifically the entire embossing material according to the invention is attacked, but the etching chemical reaches the substrate surface that is actually to be etched at the correspondingly correctly structured places more quickly since the thickness of the embossing material according to the invention there in particular is smaller by a multiple. After the etching of the embossing material according to the invention by a corresponding chemical, the etching of the actual surface can then be carried out with a second etching chemical that is in general different from the first etching chemical. After successful etching, the embossing material according to the invention is removed completely by the first etching chemical from the surface of the substrate that is to be etched.

In a quite special, in particular independent, embodiment, an embossing die can be used that was coated only at some places with a material that is opaque to electromagnetic beams. If the embossing material according to the invention is illuminated by the embossing die, the places coated with the material that is opaque to the electromagnetic beams block the electromagnetic radiation and thus prevent the hardening of the subjacent embossing material according to the invention. Because of this specially prepared embossing die, in the most ideal case, an etching of the hardened embossing material by aggressive chemicals is unnecessary, since the non-hardened places of the embossing material according to the invention can be removed by less aggressive chemicals. After the etching mask was produced from the embossing material according to the invention, in turn the surface of the substrate can be etched with the corresponding chemicals. In a last process step, the etching mask is removed by corresponding chemicals.

In a fifth, in particular independent, embodiment according to the invention, the embossing material according to the invention is used to emboss/produce an embossing die therefrom. An embossing die, which is based on the embossing material according to the invention, has all of the above-mentioned advantages.

In a sixth, in particular independent, embodiment according to the invention, the embossing material according to the invention is transferred by a contact lithography method. In this case, on the one hand, advantage is taken of the fact that the adhesion between embossing material according to the invention and embossing die in the holding of the embossing material according to the invention is strong enough to make the embossing material according to the invention adhere to the embossing die. On the other hand, the adhesion between the embossing material according to the invention and the surface of the substrate that is to be embossed is greater than the adhesion between the embossing material according to the invention and the embossing die, so that a one-sided transfer of the embossing material according to the invention is conceivable. Preferably, more than 50% of the embossing material is transferred. Especially preferably, in this case, the adhesion that can be set in the embossing material according to the invention is exploited via the correct selection of the secondary component(s), their chemical structure, amount, and chemical and/or physical binding behavior.

In a seventh, in particular independent, embodiment according to the invention, the embossing material according to the invention is used as a protective layer with through contact points. In this case, the embossing material according to the invention is opened via corresponding contacts by an etching process. The embossing material according to the invention is then used as a dielectric layer with open contact access points.

In an eighth, in particular independent, embodiment according to the invention, the use of the embossing material according to the invention is conceivable as a mask for a transfer etching process. This refers first to the fact that the embossing material is embossed over a substrate that is actually to be structured in the shape that later the substrate that is to be structured is/is to have. In particular, the embossing of a lens with the embossing material according to the invention on a silicon substrate would be conceivable. The embossing material according to the invention is continuously etched away by a chemical and/or physical etching process. Since the layer thickness of the embossing material according to the invention is inhomogeneous, the substrate that is to be etched is reached earlier by the etching chemical or is reached in a physical etching process earlier by the sputter atoms and/or sputter molecules at places with less embossing material according to the invention. Thus, the etching process begins at some places earlier than at other places. It is shown that in an etching isotropy of the embossing material according to the invention (which is virtually always present because of the amorphous nature of the embossing material according to the invention), the shape that is embossed in the embossing material according to the invention can be transferred directly into the subjacent substrate. The structures in the embossing material are distinguished from the structures that are to be produced in the substrate at different etching rates between embossing material and material that is to be etched. Transfer etching processes are suitable primarily in the structuring of materials that cannot be formed in the conventional way. For example, it is primarily of very great importance in the infrared optics to produce silicon lenses. In the wavelength range of the infrared radiation, silicon has a refraction index of more than 3.5, while the refraction index of quartz glass in the same wavelength range is only around 1.45.

Additional conceivable materials that could be produced by the embodiment according to the invention and that have correspondingly high refraction indices are CaF, ZnS, sapphire, germanium, BaF, and ZnSe. The resolution capacity of a lens is all the better the shorter the wavelength that is used and the larger the numerical aperture. The numerical aperture is the product of the sine of the acceptance angle and the refraction index. The larger the refraction index of a material, the greater the possible resolution with a constant acceptance angle and constant wavelength. Therefore, silicon is a material that is much better suited for the infrared range than quartz glass. Unfortunately, it cannot be as easily produced by corresponding wet-chemical processes but rather is used either as a monocrystal or as poly-silicon, i.e., as a polycrystal. In a correspondingly simple manner, the structuring of the silicon would be configured with the disclosed transfer etching process. The transfer etching process can also be used successfully according to the invention to produce Patterned Sapphire Substrate (PSS) or Nano Patterned Sapphire Substrate (nPSS). In this case, these are structured sapphire substrates that are primarily used in the production of highly efficient LEDs.

BRIEF DESCRIPTION OF THE DRAWINGS

Additional features and embodiments of the invention follow from the claims as well as the subsequent description of figures in the drawings, in which:

DETAILED DESCRIPTION OF THE INVENTION

Figure 1:
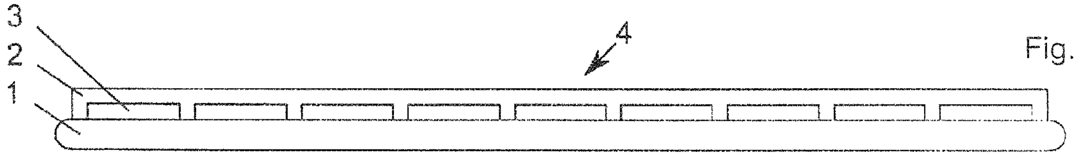
FIG. 1 is a diagrammatic cross-sectional depiction of a first use according to the invention of an embossing material according to the invention.

FIG. 1 shows a first use of the embossing material 2 according to the invention for encapsulating or for protecting functional units 3 on a substrate 1 by the primary forming of a first embossing form 4.

Figure 2:
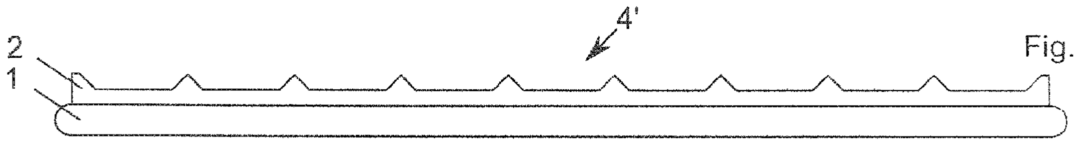
FIG. 2 is a diagrammatic cross-sectional depiction of a second use according to the invention of an embossing material according to the invention.

FIG. 2 shows a second use of the embossing material 2 according to the invention as a basic material and construction material by the primary forming of a second embossing form 4'.

Figure 3:
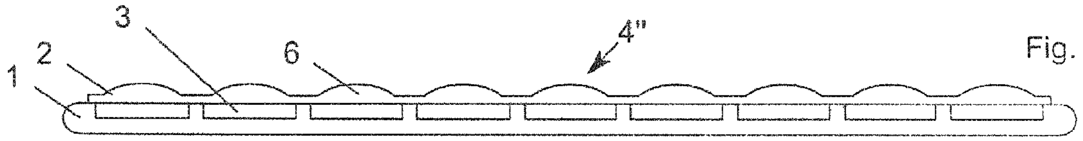
FIG. 3 is a diagrammatic cross-sectional depiction of a third use according to the invention of an embossing material according to the invention.

FIG. 3 shows a third use of the embossing material 2 according to the invention for the production of optical elements 6 via functional units 3. In this case, the optical elements 6 can preferably be embossed directly via the functional units 3 by the primary forming of a third embossing form 4".

Figure 4:
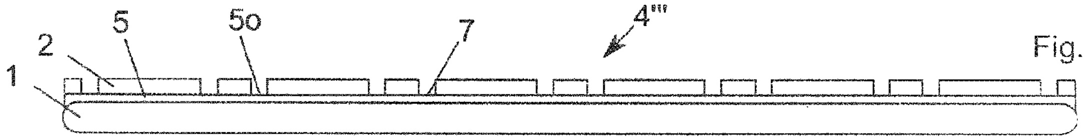
FIG. 4 is a diagrammatic cross-sectional depiction of a fourth use according to the invention of an etching mask made of the embossing material.

FIG. 4 shows a fourth use of the embossing material 2 according to the invention as an etching mask with already present through contact points 7 by the primary forming of a fourth embossing form 4'". The through contact points 7 reach up to the surface 50*o* of the layer 5 that is to be etched.

Figure 5:
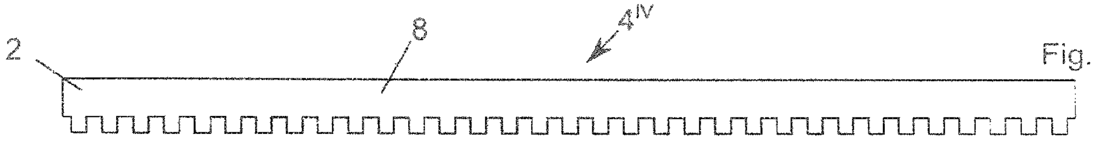
FIG. 5 is a diagrammatic cross-sectional depiction of a fifth use according to the invention of an embossing material according to the invention as an embossing die.

FIG. 5 shows a fifth use of the embossing material 2 according to the invention as a die 8 by the primary forming of a fifth embossing form $\mathbf{4}^{IV}$.

Figure 6:
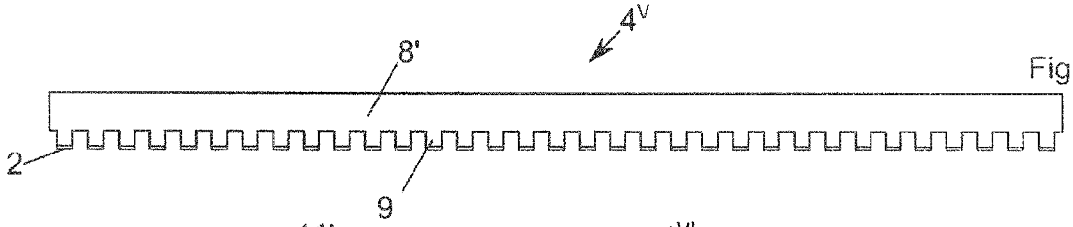
FIG. 6 is a diagrammatic cross-sectional depiction of a sixth use according to the invention of an embossing material according to the invention in contact lithography.

FIG. 6 shows a sixth use of the embossing material 2 according to the invention as embossing material on the embossing structures 9 of a die 8' in a sixth embossing form 4V.

Figure 7:
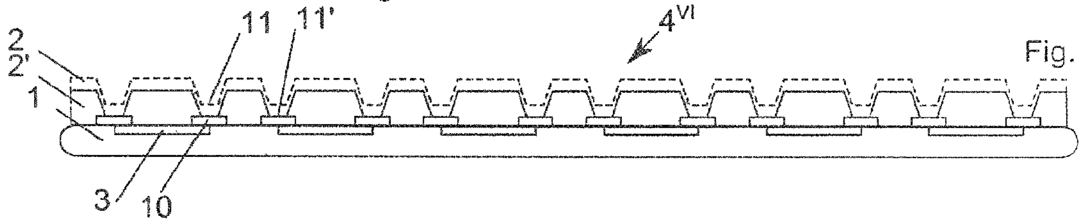
FIG. 7 is a diagrammatic cross-sectional depiction of a seventh use according to the invention of an embossing material according to the invention as a locally limited, through-etched insulating layer.

FIG. 7 shows a seventh use of the embossing material 2 according to the invention. In a first process step, an embossing step, structuring of the embossing material 2, applied on the substrate 1, is carried out in such a way that the embossing material 2 has still unopened contact access points 11 via electrically conductive contacts 10. The contacts 10 are connected to, for example, the functional units 3. In a second process step, an etching step, the embossing material 2 is etched until the still unopened contact access points 11 were etched completely to form the contact access points 11'. The contact access points 11' reach to the contacts 10. In other process steps, not shown, a coating of the embossing material 2' with a conductive material, which connects the contacts 10 with the surface of the embossing material 2' or makes possible connections to individual contacts, can then be carried out.

Figure 8:
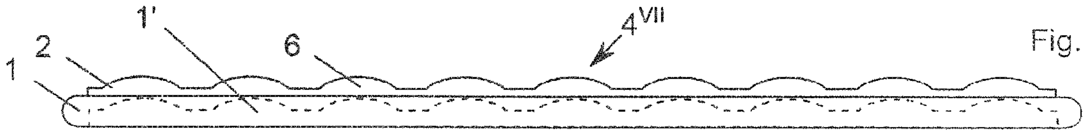
FIG. 8 is a diagrammatic cross-sectional depiction of an eighth use according to the invention of an embossing material according to the invention as a transfer etching mask.

FIG. 8 shows an eighth use of the embossing material 2 according to the invention as a transfer etching mask. In a first process step, the embossing material 2 according to the invention is structured. In FIG. 8, a structuring, by way of example, can be seen in the form of several lenses 6. The structured embossing material 2 according to the invention is located on a substrate 1 that is actually to be etched. The substrate 1 is to form etched substrate 1' by an etching process, not shown. The shape of the embossing material 2 according to the invention was transferred into the substrate 1 in such a way that the shape was completely lost. In the example shown, the etching rate is the same between the embossing material 2 and the substrate 1. Should the latter be different, the shape of the structure is changed, in the concrete example of the lenses 6, in the transfer.

REFERENCE SYMBOL LIST

1 Substrate
2, 2' Embossing Material
3, 3' Functional Unit
4, 4', 4", 4'", $\mathbf{4}^{IV}$, $\mathbf{4}^{V}$, $\mathbf{4}^{VI}$, $\mathbf{4}^{VII}$ Embossing Form
5 Layer
6 Optical Elements
7 Through Contact Point
8, 8' Die
9 Embossing Structures
10 Contact
11, 11' Contact Access Points Having described the invention, the following is claimed:

1. An embossing system for embossing a substrate to form an embossed material thereon, said embossing system comprising:

an embossing material to be embossed onto the substrate, the embossing material comprising:

one or more polymerizable main inorganic components based on silicon oxide and selected from the group consisting of polyhedral oligomeric silsesquioxane (POSS), polydimethylsiloxane (PDMS), and tetraethylorthosilicate (TEOS); and one or more secondary components selected from the group consisting of acrylics, epoxides, epoxy resins, phenols, alkanes, alkenes, alkynes, and benzenes; and an embossing die configured to emboss the embossing material onto the substrate;

wherein a proportion by weight of the polymerizable main inorganic components in the embossing material is greater than a proportion by weight of the secondary components in the embossing material, wherein adhesion between the embossed material and the embossing die is less than 2.5 $J/m^2$, wherein, when the embossing material is hydrophilic, the embossing die is hydrophobic, wherein, when the embossing material is hydrophobic, the embossing die is hydrophilic, wherein the embossing material consists of the one or more polymerizable main inorganic components, the secondary components, a solvent, and an activated initiator, and wherein the secondary components are not copolymerizable with the polymerizable main inorganic components.

2. An embossing system according to claim 1, wherein the embossing material is comprised of a chain of polymerized monomers having a chain length of at least two monomers.

3. An embossing system according to claim 1, wherein the proportion by weight of the one or more polymerizable main inorganic components in the embossing material is less than 10%, wherein the proportion by weight of the secondary components in the embossing material is less than 2%, wherein a proportion by weight of the solvent in the embossing material is less than 98%, and wherein a proportion by weight of the activated initiator in the embossing material is less than 2%.

4. A method of embossing an embossing material onto a substrate with an embossing die to form an embossed material thereon, the method comprising:

coating the substrate with an embossing material consisting of one or more polymerizable main inorganic components based on silicon oxide, one or more secondary components, a solvent, and an initiator;

applying the embossing die to the embossing material to mold the embossing material;

curing only the polymerizable main inorganic components of the embossing material on the substrate during the application of the embossing die to the embossing material to form the embossed material on the substrate; and demolding the embossing die from the embossed material after the curing, wherein the one or more polymerizable main inorganic components are selected from the group consisting of polyhedral oligomeric silsesquioxane (POSS), polydimethylsiloxane (PDMS), and tetraethylorthosilicate (TEOS); and wherein the one or more secondary components are selected from the group consisting of acrylics, epoxides, epoxy resins, phenols, alkanes, alkenes, alkynes, and benzenes;

wherein a proportion by weight of the main inorganic components in the embossing material is greater than a proportion by weight of the secondary components in the embossing material, wherein adhesion between the embossed material and the embossing die is less than 2.5 $J/m^2$, wherein, when the embossing material is hydrophilic, the embossing die is hydrophobic, and wherein, when the embossing material is hydrophobic, the embossing die is hydrophilic.

5. An embossing method according to claim 4, wherein the proportion by weight of the one or more polymerizable main inorganic components in the embossing material is less than 10%, wherein the proportion by weight of the secondary components in the embossing material is less than 2%, wherein a proportion by weight of the solvent in the embossing material is less than 98%, and wherein a proportion by weight of the initiator in the embossing material is less than 2%.

6. An embossing system for embossing a substrate to form an embossed material thereon, said embossing system comprising:

a hydrophobic embossing material to be embossed onto the substrate, the embossing material comprising:

one or more polymerizable main inorganic components based on silicon oxide and selected from the group consisting of polyhedral oligomeric silsesquioxane (POSS), polydimethylsiloxane (PDMS), and tetraethylorthosilicate (TEOS); and one or more secondary components selected from the group consisting of acrylics, epoxides, epoxy resins, phenols, alkanes, alkenes, alkynes, and benzenes; and a hydrophobic embossing die configured to emboss the embossing material onto the substrate, wherein a proportion by weight of the main inorganic components in the embossing material is greater than a proportion by weight of the secondary components in the embossing material, wherein adhesion between the embossed material and the embossing die is less than 2.5 $J/m^2$, and wherein the secondary components are not copolymerizable with the polymerizable main inorganic components.

7. An embossing system according to claim 6, wherein the embossing material consists of the one or more polymerizable main inorganic components, the secondary components, a solvent, and an activated initiator, wherein the proportion by weight of the one or more polymerizable main inorganic components in the embossing material is less than 10%, wherein the proportion by weight of the secondary components in the embossing material is less than 2%, wherein a proportion by weight of the solvent in the embossing material is less than 98%, and wherein a proportion by weight of the activated initiator in the embossing material is less than 2%.

* * * * *